United States Patent
Ali et al.

(10) Patent No.: US 9,680,217 B2
(45) Date of Patent: *Jun. 13, 2017

(54) DYNAMIC REAL-TIME CALIBRATION FOR ANTENNA MATCHING IN A RADIO FREQUENCY RECEIVER SYSTEM

(71) Applicant: BlackBerry Limited, Waterloo (CA)

(72) Inventors: Shirook M. Ali, Milton (CA); James Warden, Fort Worth, TX (US); Mohamed Bakr, Burlington (CA)

(73) Assignee: BlackBerry Limited, Waterloo, Ontario (CA)

( * ) Notice: Subject to any disclaimer, the term of this patent is extended or adjusted under 35 U.S.C. 154(b) by 452 days.

This patent is subject to a terminal disclaimer.

(21) Appl. No.: 14/243,592

(22) Filed: Apr. 2, 2014

(65) Prior Publication Data
US 2014/0210686 A1 Jul. 31, 2014

Related U.S. Application Data

(63) Continuation of application No. 12/579,381, filed on Oct. 14, 2009, now Pat. No. 8,774,743.

(51) Int. Cl.
H04B 1/16 (2006.01)
H01Q 1/50 (2006.01)
(Continued)

(52) U.S. Cl.
CPC ............ *H01Q 1/50* (2013.01); *H01Q 3/267* (2013.01); *H03H 7/40* (2013.01)

(58) Field of Classification Search
USPC .... 455/193.1–195.1, 226.1–226.4, 120–126, 455/77, 340
See application file for complete search history.

(56) References Cited

U.S. PATENT DOCUMENTS 3,366,883 A 1/1968 Griffin et al.
3,590,385 A 6/1971 Sabo et al.
(Continued)

FOREIGN PATENT DOCUMENTS

EP 2037576 A2 3/2009
FR 2573940 A1 5/1986

OTHER PUBLICATIONS

Kai Chang et al., "Low-Cost Microwave/Millimeter-Wave Impedance Measuring Scheme Using a Three-Probe Microstrip Circuit", IEEE Transactions on Microwave Theory and Techniques, IEEE Service Center, Piscataway, NJ, US, vol. 38, No. 10, Oct. 1, 1990, pp. 1455-1460, XP000150797, ISSN: 0018-9480, DOI: 10.1109/22.58685.

(Continued)

*Primary Examiner* — Edward Urban
*Assistant Examiner* — Rui Hu
(74) *Attorney, Agent, or Firm* — Fish & Richardson P.C.

(57) ABSTRACT

Real-time calibration of a tunable matching network that matches the dynamic impedance of an antenna in a radio frequency receiver system. The radio frequency receiver system includes two non-linear equations that may be solved to determine the reflection coefficient of the antenna. The tunable matching network is repeatedly perturbed and the power received by the antenna is measured after each perturbation at the same node in the matching network. The measured power values are used by an optimizer in converging to a solution that provides the reflection coefficient of the antenna. The reflection coefficient of the antenna may be used to determine the input impedance of the antenna. The elements of the matching circuit are then adjusted to match the input impedance of the antenna.

15 Claims, 9 Drawing Sheets

(51) Int. Cl.
*H01Q 3/26* (2006.01)
*H03H 7/40* (2006.01)

(56) References Cited

U.S. PATENT DOCUMENTS

| | | | | |
|---|---|---|---|---|
| 4,165,493 | A * | 8/1979 | Harrington | H03F 1/52 330/207 P |
| 4,739,329 | A * | 4/1988 | Ward | G01S 7/003 342/119 |
| 5,564,086 | A | 10/1996 | Cygan et al. | |
| 5,991,282 | A | 11/1999 | Langlet | |
| 6,326,922 | B1 | 12/2001 | Hegendoerfer | |
| 6,414,562 | B1 | 7/2002 | Bouisse et al. | |
| 6,671,859 | B1 * | 12/2003 | Naylor | G06F 17/5072 716/113 |
| 6,757,423 | B1 * | 6/2004 | Amini | G06T 7/251 382/128 |
| 6,788,920 | B1 | 9/2004 | Zamat | |
| 6,895,225 | B1 | 5/2005 | Talvitie et al. | |
| 7,071,776 | B2 * | 7/2006 | Forrester | H03G 3/001 330/129 |
| 7,512,384 | B2 | 3/2009 | Toda et al. | |
| 7,528,674 | B2 | 5/2009 | Kato et al. | |
| 7,586,384 | B2 | 9/2009 | Ranta | |
| 7,711,337 | B2 | 5/2010 | Mckinzie et al. | |
| 7,756,486 | B1 * | 7/2010 | Tan | H04B 1/525 323/222 |
| 7,831,219 | B2 | 11/2010 | Heuermann et al. | |
| 7,865,154 | B2 | 1/2011 | Mendolia et al. | |
| 7,917,104 | B2 * | 3/2011 | Manssen | H01Q 1/242 455/115.1 |
| 7,925,220 | B2 * | 4/2011 | Baker | H03L 7/085 324/527 |
| 7,933,574 | B2 * | 4/2011 | Rofougaran | H03H 7/38 455/193.1 |
| 8,098,210 | B2 * | 1/2012 | Massey | H04B 1/18 333/124 |
| 8,140,033 | B2 * | 3/2012 | Chan Wai Po | H03F 1/56 455/115.1 |
| 8,310,309 | B2 * | 11/2012 | Behera | H03F 3/189 330/255 |
| 8,326,234 | B2 * | 12/2012 | Bakalski | H04B 1/48 333/103 |
| 8,472,905 | B2 * | 6/2013 | Rofougaran | H04B 1/18 455/193.1 |
| 8,543,071 | B2 * | 9/2013 | El Kaamouchi | H04B 1/04 455/107 |
| 8,774,743 | B2 * | 7/2014 | Ali | H01Q 3/267 455/125 |
| 2003/0048223 | A1 | 3/2003 | Kezys | |
| 2003/0184319 | A1 * | 10/2003 | Nishimori | H03H 11/30 324/684 |
| 2004/0009754 | A1 | 1/2004 | Smith | |
| 2005/0146387 | A1 | 7/2005 | Toda et al. | |
| 2006/0025088 | A1 | 2/2006 | Pietig et al. | |
| 2006/0160501 | A1 * | 7/2006 | Mendolia | H01P 5/04 455/125 |
| 2007/0010217 | A1 | 1/2007 | Takahashi et al. | |
| 2007/0035356 | A1 * | 2/2007 | Ranta | H03H 7/38 333/17.3 |
| 2007/0149146 | A1 * | 6/2007 | Hwang | H01Q 1/242 455/80 |
| 2007/0155347 | A1 | 7/2007 | Heuermann et al. | |
| 2007/0197180 | A1 * | 8/2007 | McKinzie, III | H03H 7/40 455/248.1 |
| 2008/0077361 | A1 * | 3/2008 | Boyd | B25J 9/1612 702/189 |
| 2008/0106350 | A1 * | 5/2008 | McKinzie | H03H 7/40 333/17.3 |
| 2008/0180345 | A1 | 7/2008 | Larson et al. | |
| 2008/0180346 | A1 | 7/2008 | Rofougaran | |
| 2008/0214125 | A1 * | 9/2008 | Haque | H03F 1/0261 455/90.2 |
| 2008/0261544 | A1 | 10/2008 | Blin | |
| 2009/0011732 | A1 | 1/2009 | Bayruns | |
| 2009/0066440 | A1 * | 3/2009 | Chan Wai Po | H03F 1/56 333/32 |
| 2009/0121963 | A1 | 5/2009 | Greene | |
| 2009/0157334 | A1 | 6/2009 | Goodnow et al. | |
| 2009/0161586 | A1 | 6/2009 | Kasai et al. | |
| 2009/0179807 | A1 * | 7/2009 | Peng | H01Q 1/24 343/749 |
| 2009/0267746 | A1 * | 10/2009 | Muchkaev | H04Q 9/00 340/10.4 |
| 2009/0289735 | A1 | 11/2009 | Womac | |
| 2010/0069011 | A1 * | 3/2010 | Carrick | G06K 7/0008 455/63.1 |
| 2010/0085260 | A1 * | 4/2010 | McKinzie | H01Q 9/0407 343/703 |
| 2010/0289711 | A1 * | 11/2010 | Boyle | H03H 7/40 343/750 |
| 2010/0317297 | A1 * | 12/2010 | Kratochwil | H04W 52/0251 455/67.11 |
| 2011/0043298 | A1 * | 2/2011 | McKinzie, III | H03H 7/40 333/17.3 |
| 2011/0075886 | A1 * | 3/2011 | Ashjaee | G01C 21/005 382/106 |
| 2011/0086600 | A1 | 4/2011 | Muhammad | |
| 2011/0163935 | A1 | 7/2011 | de Jongh et al. | |

OTHER PUBLICATIONS

Examination Report mailed Jul. 30, 2013, in corresponding European patent application No. 10775964.9.
International Preliminary Report on Patentability mailed Dec. 23, 2011; in corresponding PCT patent application No. PCT/US2010/52648.
Parfitt et al.; "The Design of Active Receiving Antennas for Broadband Low-Noise Operation", pp. 1-4; www.ursi.org/Proceedings/ProcGA02/papers/p1001.pdf; downloaded Jan. 5, 2012.
International Search Report and Written Opinion mailed Jan. 24, 2011; in corresponding PCT patent application No. PCT/US2010/052648.
J. Vian, "Double-Stub Impedance Matching Algorithm, Antennas and Propagation International Symposium", IEEE, Jun. 1, 2007.
W.H.Press et al.; "Root Finding and Nonlinear Sets of Equations, Numerical Recipes in C": The Art of Scientific Computing, Cambridge University Press, Feb. 1993.
H. Oba et al.; "Adaptive Impedance Matching System Using FPGA Processor for Efficient Control Algorithm", IEICE Transactions on Electronics, Electronics Society, Tokyo, japan, vol. E91C, No. 8; Aug. 1, 2008.
J. De Mingo et al.; "An RF Electronically Controlled Impedance Tuning Network Design and its Application to an Antenna Input Impedance Automatic Matching System", IEEE Transactions on Microwave Theory and Techniques, IEEE Service Center, vol. 52, No. 2 ; Feb. 1, 2004; pp. 489-497.
Qiao et al.; "Antenna Impedance Mismatch Measurement and Correction for Adaptive CDMA Transceivers"; pp. 1-4, Microwave Symposium Digest, 2005 IEEE MTT-S International; Jun. 12-17, 2005.
Oh, et al.; "Automatic antenna-tuning unit for software-defined and cognitive radio"; Wireless Communications and Mobile Computing, Wiley InterScience ; 2007, pp. 1-13.
Toftgard et al.; "Effects on Portable Antennas of the Presence of a Person"; IEEE Transactions on antennas and propagation, vol. 41; No. 6 ; Jun. 1993, pp. 739-746.
Ogawa, et al.; "An Analysis of the Performance of a Handset Diversity Antenna Influenced by Head, hand and Shoulder Effects at 900 MHz: Part I—Effective Gain Characteristics", IEEE Transactions on Vehicular Technology, vol. 50, No. 3 ; May 2001; pp. 830-844.
"WiSpry programmable RF Silicon Solutions", WiSpry, 2009; 1 page; retrieved Sep. 16, 2009.
"Adaptive RF: Iconic Phones with No Compromises", http://www.paratek.com; Paratek; p. 1; retrieved Sep. 16, 2009.

(56) References Cited

OTHER PUBLICATIONS

Pozar; "Microwave Engineering", 1990; Addison-Wesley Publishing Company; Table of contents, pp. 1-12.
Communication Pursuant to Article 94(3) EPC issued in EP Application No. 10775964.9 on Mar. 18, 2015; 5 pages.

* cited by examiner

DYNAMIC REAL-TIME CALIBRATION FOR ANTENNA MATCHING IN A RADIO FREQUENCY RECEIVER SYSTEM

CROSS-REFERENCE TO RELATED APPLICATIONS

The present application is a continuation of U.S. patent application Ser. No. 12/579,381 filed Oct. 14, 2009 and is incorporated by reference herein in its entirety. U.S. Patent Application No. is related to U.S. patent application Ser. No. 12/579,370, entitled Dynamic Real-Time Calibration for Antenna Matching in a Radio Frequency Transmitter System filed on Oct. 14, 2009, now U.S. Pat. No. 8,190,109, which is herein incorporated by reference in its entirety.

BACKGROUND

Technical Field

This disclosure relates to wireless communications and more specifically to the design and implementation of a wireless radio frequency receiver system that dynamically matches the impedance of an antenna in real-time.

Description of the Related Art

The environment in which a wireless or radio frequency system is located often affects the operation of antennas associated with this system. For example, the power delivered by an antenna changes with proximity to objects. These objects may include, for example, without limitation, a human object, a metal object, a car, an aircraft, a building, other such objects, or a combination of objects. In maximizing the utility of a radio frequency system, it is important to compensate for environmental factors that are relative to the antenna and may cause suboptimal or poor operation. In mobile communication systems, poor operation may translate into undesired effects. These undesirable effects may include, for example, dropped calls, choppy audio, and other similar effects. These types of effects may indicate that the antenna of a system is not properly tuned within the current environment.

Receiver systems may increase the power efficiency or the power delivered by an antenna by determining in advance the possible environments or scenarios in which a radio frequency antenna may be used. Based on the types of environmental scenarios in which the radio frequency antenna may be used, the elements of the matching network system may be set to specific values that adequately compensate for the various changes in the environment that may affect the polarization, impedance, or resonant frequency of the radio frequency antenna.

BRIEF DESCRIPTION OF THE DRAWINGS

For a better understanding of the disclosure and the various embodiments described herein, reference is now made to the following brief description, taken in connection with the accompanying drawings and detailed description, which show at least one exemplary embodiment.

DETAILED DESCRIPTION

Figure 1:
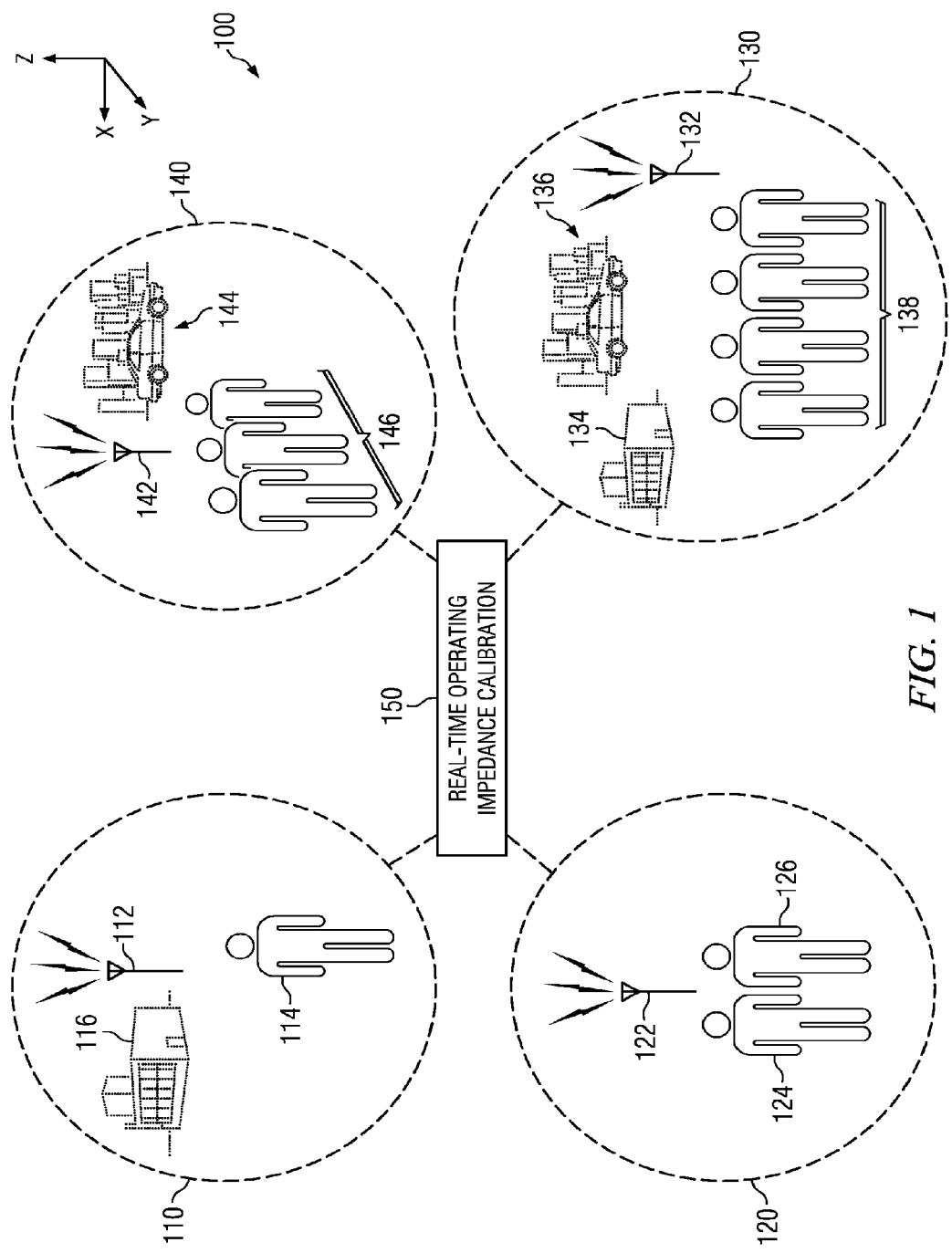
FIG. 1 illustrates a block diagram of a number of different environments in which embodiments of the disclosure may operate.

It should be understood at the outset that although an illustrative implementation of one or more embodiments are provided below, the description is not to be considered as limiting the scope of the embodiments described herein. The disclosure may be implemented using any number of techniques, whether currently known or in existence. The disclosure should in no way be limited to the illustrative implementations, drawings, and techniques illustrated and described herein, which may be modified within the scope of the appended claims along with a full scope of equivalence. It should be appreciated that for simplicity and clarity of illustration, where considered appropriate, the reference numerals may be repeated among the figures to indicate corresponding or analogous elements.

According to one illustrative embodiment, a wireless communication system comprises an antenna, a control system that calculates a value of an impedance of the antenna in real-time to match a load in a radio frequency receiver system, and a matching network that is tunable by the control system to match the calculated values of the input impedance to a load on the radio frequency receiver system.

In accordance with another embodiment of the disclosure, a network server comprising a computer recordable storage medium is provided. The computer recordable storage medium of the network server comprises executable program code that is executed by a process to perform actions including solving, with a non-linear optimizer, for a reflection coefficient of an antenna by calculating a solution to two non-linear equations, converting, through a processor, the reflection coefficient to a value of an input impedance of the antenna, and tuning a number of reactive elements of a matching network to values that match the input impedance.

In accordance with a further embodiment of the disclosure, a computer implemented method of matching the impedance of an antenna provides actions comprising solving with a non-linear optimizer, for a reflection coefficient of an antenna, $\Gamma_A$ by calculating simultaneously a solution to two non-linear equations, converting, through a controller, the reflection coefficient to a value of an input impedance of the antenna; and tuning a number of reactive elements of a matching network to values that match the input impedance.

The present disclosure provides a tunable matching network in a radio frequency receiver system that matches, in real-time, the impedance of an antenna that may change dynamically because of various environmental factors. "Dynamic", as used in this disclosure, means adaptive or continuous changes responsive to a particular event or situation. In this application, "dynamic" refers to continuous changes in reaction to the environment or surroundings. The exact environmental variables that affect the antenna operation are not known or predictable. The impedance of an antenna may dynamically change as a result of a number of different factors, including, but not in any way limited to antenna orientation and the proximity of the antenna to a number of bodies and objects, including inanimate objects.

As used within this disclosure, "a number of" refers to one or more items. "Real-time", as used within this disclosure, refers to the continuous or on-going processing of information without delay during the operation of hardware, software, or hardware and software. For example, a device or other hardware, software, or hardware/software combination is not considered to be operating in real-time when it is turned off, in a low power mode, a sleep mode, or a standby mode.

The tunable matching network adapts the impedance of an antenna for a particular environment. Specifically, as the environment or the orientation of an antenna within an environment is changed, the input impedance of the antenna is calculated in real-time and the reactive elements of the matching network are calibrated continuously or dynamically to match the calculated input impedance of the antenna and tune the antenna to achieve optimal signal quality.

The input impedance of the antenna is calculated in real-time through solving non-linear equations derived to determine the value of the reflection coefficient of the antenna, Gamma A, $\Gamma_A$. Gamma A is a dynamic parameter of the antenna that changes with proximity to objects within a particular environment. The calculation of Gamma A in real-time allows the input impedance of the antenna to be determined dynamically. One or more reactive elements of the matching network may be adjusted to match the determined input impedance and maximize the power received from the antenna to the receiver system.

Turning first to FIG. 1, a number of different environmental scenarios 100 in which embodiments of the disclosure may operate is illustrated. It must be noted that the number of environmental scenarios illustrated in number of environmental scenarios 100 is not limited to the number depicted. Scenarios 110, 120, 130 and 140 illustrate environmental factors that may cause an antenna to be detuned. In scenario 110, antenna 112 may be detuned by the presence of body 114 or an inanimate object, such as building 116. There may be other objects in close proximity to the antenna that cause the antenna to detune. Close proximity may be within a few feet or at least one meter. In general, objects surrounding the antenna or close to the antenna, within a distance of about $\lambda/2\pi$, will couple with the antenna and cause the antenna to detune. The objects in the proximity of the antenna may absorb, reflect or diffract the radiated power of the antenna and cause an increased loading on the antenna that detunes the antenna.

Environmental scenario 120 illustrates antenna 122 in the proximity of first body 124 and second body 126. The power radiated by antenna 122 may be absorbed by the tissues of first body 124 and second body 126. The amount of power from antenna 122 that may be absorbed by first body 124 individually or in combination with second body 126 depends on the frequency of the antenna and the location of proximity of the antenna to first body 124 and second body 126. It must be noted that although only first body 124 and second body 126 are illustrated, environmental scenario 120 is in no way limited to two bodies and may include numerous bodies or objects.

Environmental scenario 130 illustrates a number of objects in proximity of an antenna, such as antenna 132. Environmental scenario 130 includes objects such as building 134, buildings and car 136, and bodies 138. Building 134, buildings and car 136, and bodies 138 that are within a close proximity to antenna 132 will reduce the antenna efficiency and power. Environmental scenario 140 provides another illustration of environmental factors within the proximity of an antenna, such as antenna 142. In close proximity to antenna 142, environmental factors 144, singularly or in conjunction with bodies 146, couple to reduce the power that may be received by antenna 142 and results in detuning of antenna 142. It must be noted that the number and types of objects illustrated in environmental scenario 140 are not limited to the illustrated objects and may include any number of animate and inanimate objects as would be obvious to one skilled in the art.

The disclosure features real-time operating impedance calibration 150 that tunes a matching circuit within a receiver system that may be located in any number of environments including, but in no way limited to, environmental scenarios 110, 120, 130, and 140. The antenna impedance changes within each respective environmental scenario due to its proximity to different objects within the environmental scenario. The real-time operating impedance calibration control system may operate within each environmental scenario to maintain the power received by a receiver system within each respective environmental scenario at a maximum transfer value.

Figure 2:
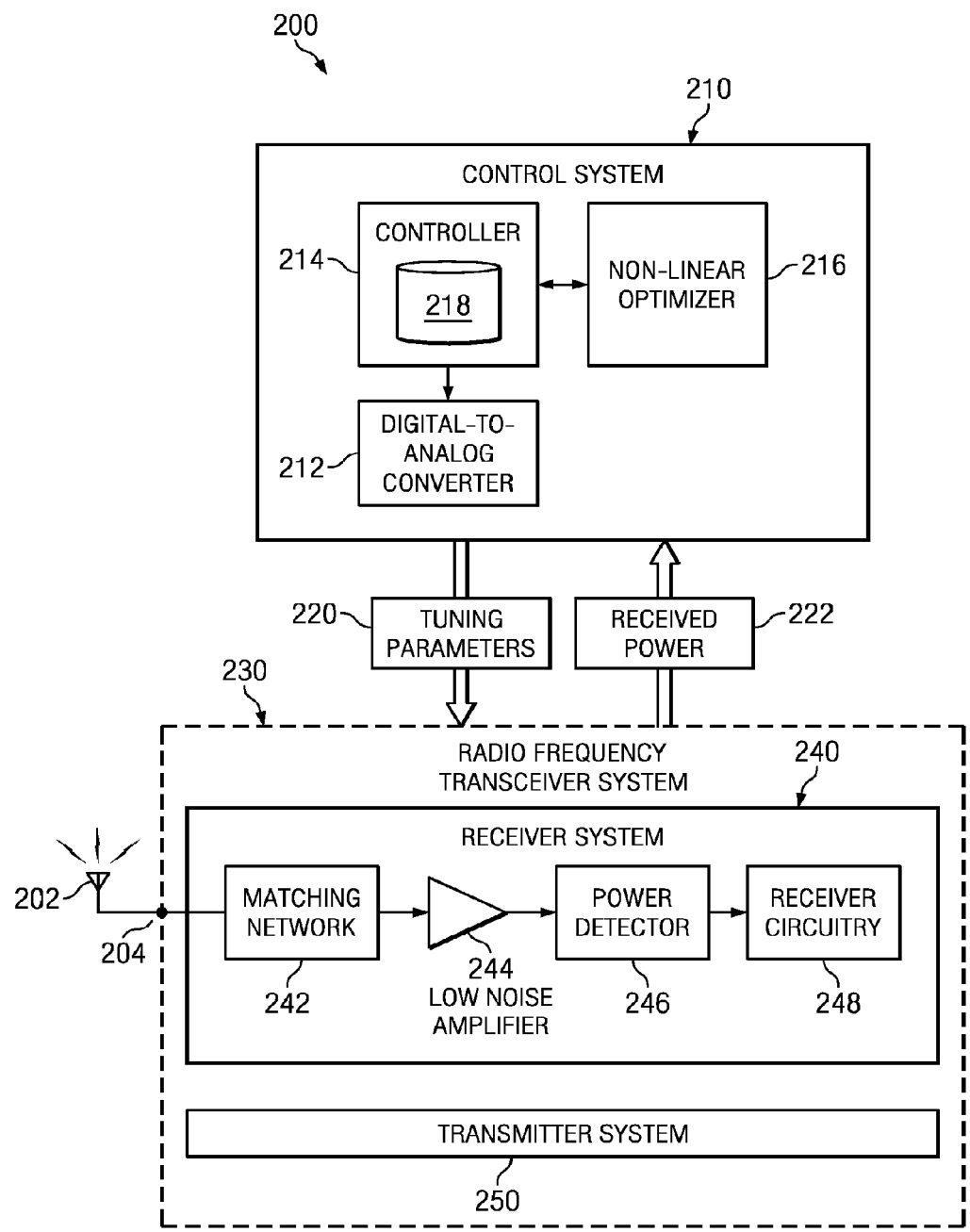
FIG. 2 illustrates a top level block diagram of a wireless system that operates in a receiver mode in accordance with an embodiment of the disclosure.

FIG. 2 illustrates a top level block diagram of a wireless system 200 that operates in a receiver mode in accordance with an illustrative embodiment of the disclosure. Wireless system 200 may be a communication system or some other type of wireless system known to one skilled in the art. In one embodiment, wireless system 200 includes radio frequency transceiver system 230, control system 210, and antenna 202. Radio frequency transceiver system 230 comprises receiver system 240 and transmitter system 250. Antenna 202 is communicatively coupled to radio frequency transceiver system 230 through antenna feedpoint 204.

In a receiver mode, antenna 202 inputs electromagnetic signals to receiver system 240 through antenna feedpoint 204. Matching network 242 comprises a number of inductive and capacitive components or reactive elements that may be varied or tuned to match the impedance of receiver system 240 with the impedance of antenna 202. Characteristic impedance of an antenna in a receiver system, such as antenna 202 in receiver system 240 is 50 ohms In order to maintain a maximum received power state, matching network 242 is continually adapted so that the impedance of receiver system 240 matches the impedance of antenna feedpoint 204. Specifically, matching network 242 includes reactive elements, such as capacitors, inductors, or other such reactive elements known to one skilled in the art, that may be tuned by control system 210 to match the input impedance of the antenna feedpoint to the input impedance of low noise amplifier 244.

Power detector 246 converts the signals detected and measured at a specific location or node of matching network 242 through low noise amplifier 244 to voltage levels that represent signal power. The power level measurements are always detected and measured at the same location or node in matching network 242. The location or node represents one single point within matching network 242.

The power levels detected by power detector 246 are input to control system 210 as received power 222 values. In the illustrative examples, power detector 246 may be a type of received signal strength sensor known to one skilled in the art that provides an indication of the power of the signal received by receiver system 240. The value of the amplitude of received power 222 is recorded and stored by controller 214 in control system 210. In one embodiment, controller 214 may include memory 218 that stores program instructions that are executed by the controller to implement features of the disclosure and other data or special instructions. In one embodiment, controller 214 may be a microprocessor. In another embodiment, controller 214 may be a Field Programmable Gateway that has programmable logic.

Controller 214 of control system 210 may determine the scattering parameters, or S-parameters, of the matching network based on the reactive element values of the matching network, the frequency of the antenna, and the reference impedance of the antenna. The scattering parameters define the energy or power of a network in terms of impedance and admittance. The scattering parameters include $S_{11}$, which represents the input reflection coefficient of a 50 ohm terminated output, $S_{21}$ which represents the forward transmission coefficient of a 50 ohm terminated output, $S_{12}$, which represents a reverse transmission coefficient of a 50 ohm terminated input; and $S_{22}$, which represents an output reflection coefficient of a 50 ohm terminated input. The scattering parameters determined by controller 214 may be input as parameters to a system of two non-linear equations. A non-linear equation is solved to determine the value of Gamma A, $\Gamma_A$, the reflection coefficient of the antenna. The reflection coefficient of antenna 202 is used to determine the input impedance of antenna 202.

In one embodiment, non-linear optimizer 216 is operated by controller 214 to solve the two non-linear equations for the reflection coefficient, Gamma A. Non-linear optimizer 216 starts with an estimated complex value of the impedance of antenna 202. The complex value of the impedance is comprised of real and imaginary numbers. Starting with this initial estimated complex value, non-linear optimizer 216 performs a repeated or iterative processing that eventually reaches a solution or converges to a final value that represents the actual input impedance of antenna 202.

Controller 214 produces an output which is transformed by digital-to-analog converter 212 to an analog control signal. In these depicted examples, the controller may have a number of output ports that output signals to a number of digital-to-analog converters. Although this embodiment illustrates one controller 214 and one digital-to-analog converter 212, one of ordinary skill in the art should recognize that a plurality of controllers and digital-to-analog converters may be used depending on an implementation of a specific embodiment. Digital-to-analog converter 212 outputs an analog control voltage that represents tuning parameters 220 that control the voltage values of the elements in matching network 242 of receiver system 240.

As antenna 202 moves in relation to a particular environmental scenario, such as environmental scenarios 110, 120, 130, and 140 illustrated in FIG. 1 or other environmental scenario that may be known to one skilled in the art, the value of the input impedance of the antenna determined by non-linear optimizer 216 will vary. The variation of the input impedance will vary the control voltage output by one or more digital analog converters. The variation of the voltages will change the tuning parameter values and change the value of the elements within matching network 242. As the input impedance of the antenna changes in or around various environmental scenarios, the impedance of the matching circuit also changes to maintain maximum and constant power transfer to receiver circuitry 248 in receiver system 240.

The embodiment of FIG. 2 may be advantageously implemented in devices that are part of wireless communication systems to improve the carrier-to-noise ratio in a radio frequency receiver system. The wireless communication systems may include mobile communication systems and other devices, such as, without limitation, pagers, cellular phones, cellular smart-phones, wireless organizers, and handheld wireless communication devices.

The illustrative embodiment of FIG. 2 is not meant to imply physical or architectural limitations to the manner in which different advantageous embodiments may be implemented. Other components or elements in addition to or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments. For example, in some illustrative embodiments of FIG. 2, receiver system 240 may include additional components, such as a band pass filter to limit the selected frequencies. In other illustrative embodiments, receiver system 240 and transmitter system 250 may be implemented as separate components that are not part of a transceiver system, such as radio frequency transceiver system 230.

Figure 3:
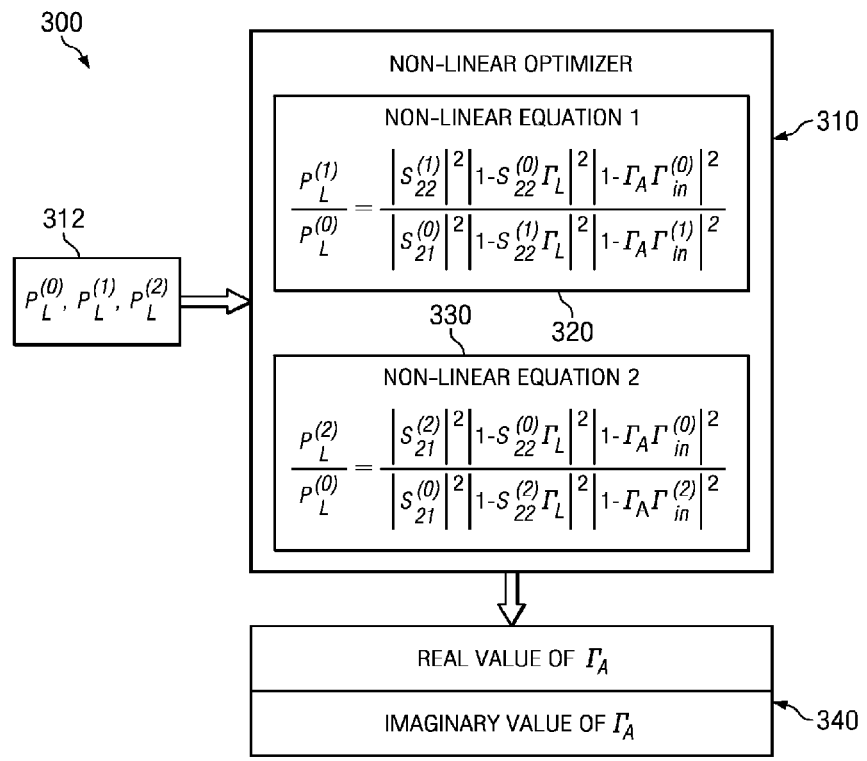
FIG. 3 illustrates a top level representation of the input and outputs of the non-linear optimizer in accordance with an embodiment of the disclosure.

Turning now to FIG. 3, top level representation 300 of a non-linear optimizer is illustrated in accordance with an illustrative embodiment of the disclosure. In this depicted example, non-linear optimizer 310 is an example of one implementation for non-linear optimizer 216 in control system 210 of FIG. 2.

As illustrated, non-linear optimizer 310 inputs three power values that represents various load values seen by the matching circuit as the values of the reactive elements in the matching circuit varies. Non-linear optimizer 310 requires a reference power value, $P_L^{(0)}$, which is determined based on the scattering matrix parameters $S_{21}$ and $S_{22}$, the impedance of the load of the receiver, and the reference impedance value of 50 ohms. The second power value, $P_L^{(1)}$, is determined by changing or perturbing the reactive elements of the matching network by a particular value. A perturbation represents an actual mathematical change or variation in value that may be a positive or negative real number or percentage.

In one embodiment, the value may be 30 percent of the normal value of a reactive element. For example, C represents the value of a capacitor in the matching network. According to this embodiment, 0.3*C would represent a 30 percent perturbation of the normal value of the capacitor C. The perturbed reactive element values are then used to calculate new values for the scattering matrix parameters. The power received by the receiver system with the perturbed scattering matrix values may be determined. In one or more illustrative embodiments of this disclosure, the superscript of a parameter represents the number of times a matching network is perturbed. For example, $P_L^{(1)}$ represents the value of the received power of the matching network measured at a first perturbation of the matching network. Similarly, $P_L^{(0)}$ represents the value of the reference received power of the matching network. The reference received power, $P_L^{(0)}$ is the power measured from a previous receiver tuning period and does not represent a value of the received power of the matching network within a current tuning period.

A third power input to non-linear optimizer, $P_L^{(2)}$, is also determined based on a second perturbation of the matching circuit that is different from the first perturbation of the matching circuit. $P_L^{(2)}$ includes a superscript of 2 and therefore represents the value of the received power of the matching network measured at a second perturbation of the matching network. In one embodiment, the second perturbation of the matching circuit is a value that is equal and opposite to the value of the first perturbation. For example, the depicted embodiment referenced herein, the perturbation of the capacitance was 30 percent of the normal value of the capacitance, 0.3*C. The second perturbation would therefore be equivalent to a –0.3*C, which represents a negative 30 percent of the value of the capacitance.

The three power values determined by the reference and perturbed states of matching circuit 312 are input to the non-linear optimizer and used to formulate a power ratio in non-linear equation one 320 and non-linear equation two 330. Non-linear equation one 320 represents a power ratio between the power determined after a first perturbation of a matching circuit, $P_L^{(1)}$, and the reference power value of the matching circuit, $P_L^{(0)}$. The received power ratio of non-linear equation one 320 is reproduced below:

$$\frac{P_L^{(1)}}{P_L^{(0)}} = \frac{|S_{22}^{(1)}|^2 |1 - S_{22}^{(0)} \Gamma_L|^2 |1 - \Gamma_A \Gamma_{in}^{(0)}|^2}{|S_{21}^{(0)}|^2 |1 - S_{22}^{(1)} \Gamma_L|^2 |1 - \Gamma_A \Gamma_{in}^{(1)}|^2} \quad (EQ. 1)$$

In non-linear equation one 320, the only unknown values are the real and imaginary parts of Gamma A, $\Gamma_A$. The scattering parameters or S-parameters, $S_{22}$ and $S_{21}$, are known values of the matching network. $S_{21}$ is a scattering matrix parameter which represents the forward transmission coefficient of a 50 ohm terminated output. $S_{22}$ is a scattering matrix parameter that represents an output reflection coefficient of a 50 ohm terminated input. Superscript 0, designated by $^{(0)}$, represents the reference value of a specific parameter from a previous receiver tuning period. Superscript 1, designated by $^{(1)}$, represents the reference value of a specific parameter when the elements of the matching network are perturbed a first time during a tuning period. In the depicted examples, one or more elements of the matching network may be varied during a single perturbation occurrence. Non-linear equation one, EQ. 1, includes known S-parameter references values $S_{22}^{(0)}$, $S_{21}^{(0)}$ and S-parameter first perturbation value $S_{22}^{(1)}$.

The reflection coefficient of the receiver load, gamma L, $\Gamma_L$, is a known value that remains unchanged for each specific receiver or transceiver circuit or system. Each perturbation of the matching network and each tuning period have the same receiver loading. Therefore, no superscripts are associated with the receiver load, $\Gamma_L$. The input reflection coefficient, gamma in, $\Gamma_{in}$, is a known value calculated after each perturbation of the matching network. Non-linear equation one includes a known gamma in reference value, $\Gamma_{in}^{(0)}$, and known gamma in first perturbation value, $\Gamma_{in}^{(1)}$.

Similarly, non-linear equation two 330 represents a ratio between two powers $P_L^{(2)}$ and $P_L^{(0)}$. $P_L^{(2)}$ represents the power received by the control system after a second perturbation of the matching network. $P_L^{(0)}$ represents the reference power received by the control system from a previous tuning period or other designated power value. Non-linear equation two 330 is represented below:

$$\frac{P_L^{(2)}}{P_L^{(0)}} = \frac{|S_{21}^{(2)}|^2 |1 - S_{22}^{(0)} \Gamma_L|^2 |1 - \Gamma_A \Gamma_{in}^{(0)}|^2}{|S_{21}^{(0)}|^2 |1 - S_{22}^{(2)} \Gamma_L|^2 |1 - \Gamma_A \Gamma_{in}^{(2)}|^2} \quad (EQ. 2)$$

Similar to non-linear equation one, 320, reproduced earlier in this disclosure, the only unknown values in non-linear equation two 330, or EQ. 2, are the real and imaginary parts of Gamma A, $\Gamma_A$. The other parameter values in equation two are known values. The scattering parameters or S-parameters, $S_{22}$ and $S_{21}$, are known values of the matching network. $S_{21}$ is a scattering matrix parameter which represents the forward transmission coefficient of a 50 ohm terminated output. $S_{22}$ is a scattering matrix parameter that represents an output reflection coefficient of a 50 ohm terminated input.

In this illustrative example, superscript 0, designated by $^{(0)}$, represents the reference value of a specific parameter from a previous receiver tuning period. Superscript 1, designated by $^{(1)}$, represents the reference value of a specific parameter, when the elements of the matching network are perturbed a first time during a tuning period. It must be noted that one or more elements of the matching network may be varied during a single perturbation occurrence. Non-linear equation two includes known S-parameter reference values, $S_{21}^{(0)}$, and $S_{22}^{(0)}$, and two known S-parameter second perturbation values $S_{21}^{(2)}$ and $S_{22}^{(2)}$. Non-linear equation two also includes the reflection coefficient of the receiver load, gamma L, represented as $\Gamma_L$. $\Gamma_L$ is a known value. The input reflection coefficient values, $\Gamma_{in}^{(0)}$ and $\Gamma_{in}^{(2)}$ respectively, the reference and second perturbation values of the gamma in parameter, $\Gamma_{in}$.

The real and imaginary values of Gamma A are determined by solving non-linear equation one and non-linear equation two through the operation of a non-linear optimizer. The non-linear optimizer simultaneously outputs the real value of Gamma A and the imaginary value of Gamma A 340. The real and imaginary values of Gamma A may be converted by a controller to the input impedance value that corresponds to the value of Gamma A.

Figure 4:
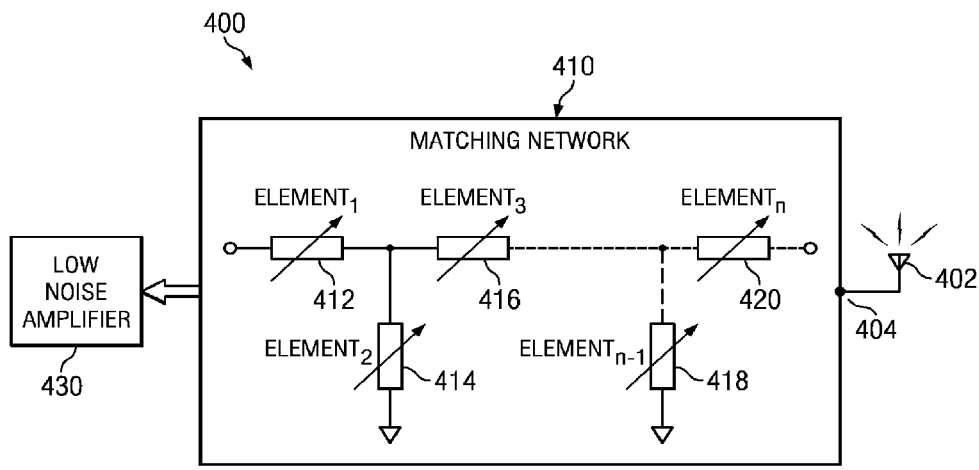
FIG. 4 illustrates a detailed view of a tunable matching network according to an embodiment of the disclosure.

FIG. 4 illustrates a more detailed view 400 of a tunable matching network in accordance with an illustrative embodiment of the disclosure. In this depicted example, matching network 410 is an example of one implementation of matching network 242 in receiver system 240 in FIG. 2.

As illustrated, matching network 410 includes a number of variable reactive elements, such as, element$_1$ 412, element$_2$ 414, element$_3$ 416, element$_{n-1}$ 418, and element$_n$ 420. It must be noted that matching network 410 may include any number of variable reactive elements based on a particular embodiment as would be understand by one of ordinary skill in the art. The variable reactive elements, 412-420, may be controlled individually or as one unit, by analog or digital voltage values that tune the value of a particular variable reactive element to correspond to a particular input impedance setting for matching network 410.

The adjustments, corrections, and changes to elements 412-420 of matching network 410 may vary in number, scope, and degree. For example, in one illustrative embodiment, matching network 410 may be incrementally tuned a number of times by a specific value or values within a particular tuning period. The tuning value or values are typically greater than or equal to about positive or negative thirty percent of the original tuning value. In another illustrative embodiment, the tuning of matching network 410 may be iterative within a particular tuning period.

Variable reactive elements of matching network 410 may represent a number of capacitors, inductors, transformers, and other such reactive elements that may be known to one skilled in the art. Antenna 402 couples to matching network 410 through antenna feedpoint 404. Matching network 410 is adapted by a control system (not shown) to match the changing impedance of antenna 402 with the impedance of low noise amplifier 430. In one embodiment, the impedance of the low noise amplifier is 50 ohms.

Figure 5:
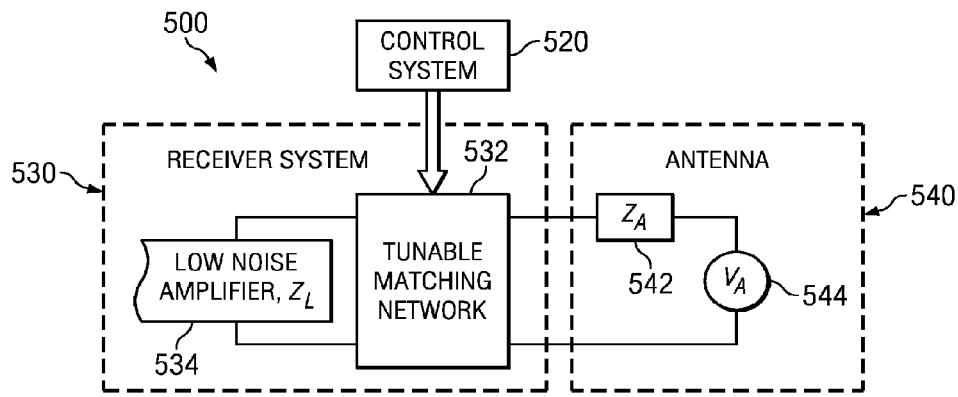
FIG. 5 illustrates a mathematical formulation of the receiver system according to an embodiment of the disclosure.

FIG. 5 illustrates mathematical representation 500 in accordance with an illustrative embodiment of the disclosure. Mathematical representation 500 includes a control system that operates to control voltage values of reactive elements in tunable matching network 532 within receiver system 530. Receiver system 530 is coupled to antenna 540. Antenna 540 provides a simple circuit model of an antenna that illustrates $Z_A$ 542, the impedance of the impedance of the antenna, and $V_A$ 544, the antenna voltage. Tunable matching network 532 is adapted by control system 520 to match the impedance of antenna 540 to the load of the impedance of low noise amplifier 534. In one embodiment, the load, $Z_L$, of the low noise amplifier 534 is equal to 50 ohms. The impedance of the load, $Z_L$, is a complex value. It must be noted that low noise amplifier 534 may include other elements that accounts for the rest of the receiver system circuitry. However, the load experienced by tunable matching network 532 is substantially based on the load of low noise amplifier 534 that is directly coupled to tunable matching network 532.

Figure 6:
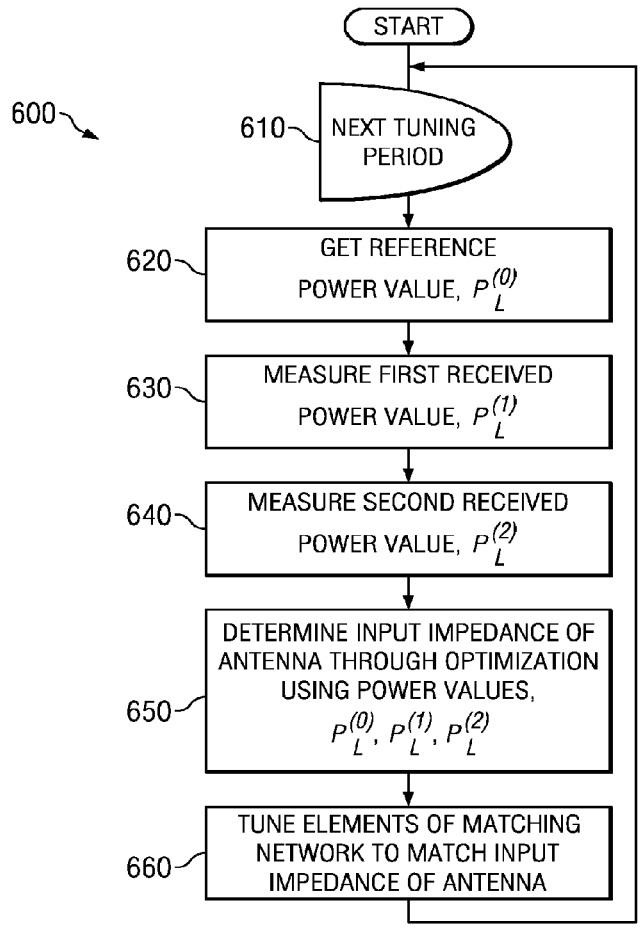
FIG. 6 illustrates a top level flowchart according to an embodiment of the disclosure.

In FIG. 6, diagram 600 illustrates a top level flowchart in accordance with an illustrative embodiment of the disclosure. At block 610, the transceiver system waits for the next receiver tuning period of a receiver cycle. The tuning periods are sequential which means that a second receiver tuning period follows a first receiver tuning period. This may also be expressed as a next receiver tuning period following a previous receiver tuning period. The availability of a current receiver tuning period initiates the process. At block 620, a reference power value, $P_L^{(0)}$, is determined. The reference power value is based on a reference impedance of 50 ohms and the scattering matrix parameters of the matching network. The reference power value will be one input to the non-linear optimizer.

The elements of the matching network are perturbed to a percentage of their represented value in the network. In some embodiments, this percentage may be about 30 percent. The percentage may be positive or negative in value. The scattering matrix parameters of the matching network with the perturbed element values is determined, and a first received power, $P_L^{(1)}$, based on the value of the perturbed elements and the value of the scattering matrix with the perturbed elements is measured at block 630.

A second received power value, $P_L^{(2)}$, is measured at block 640. The second received power measurement is based on a second perturbation of the elements of the matching network. The second perturbation of the elements may be different in value or degree from the first perturbation. For example, the first perturbation may be 30 percent of a reactive element value. A second perturbation may be a negative 30 percent of a reactive element value. The reference power value, $P_L^{(0)}$, first received power value, $P_L^{(1)}$, and the second received power value, $P_L^{(2)}$, are input as known values into two non-linear equations derived for the purpose of determining the input impedance of the antenna. The power values are used to formulate power ratios. In the first non-linear equation referenced earlier in this disclosure as EQ. 1, the power ratio represents the ratio of the power received by the load of the receiver for a first set of tuning parameters or values used in perturbing the reactive elements of the matching network. The power ratio formulated by the measured and reference power values is:

$$\frac{P_L^{(1)}}{P_L^{(0)}} \quad (1)$$

In the second non-linear equation, referenced earlier in this disclosure as EQ. 2, the second power ratio the power ratio represents the ratio of the power received by the load of the receiver for a second set of tuning parameters or values, that is different from the first set used in the first non-linear equation, used in perturbing the reactive elements of the matching network. The power ratio formulated by the measured and reference power values is represented by:

$$\frac{P_L^{(2)}}{P_L^{(0)}} \quad (2)$$

The second power ratio is the ratio of the second measured perturbed power value to the reference power value. In non-linear equations one and two, the only unknown value is the real and imaginary part of the reflection coefficient, Gamma A, $\Gamma_A$. All the other terms in the two non-linear equations are known and fixed.

Non-linear equations one and two may be simultaneously solved to determine the real and imaginary values of Gamma A. At block 650, the input impedance of the antenna is determined based on the values determined for Gamma A. At block 660, the reactive elements of a matching circuit are tuned or adapted to exactly match the input impedance of the antenna.

Figure 7:
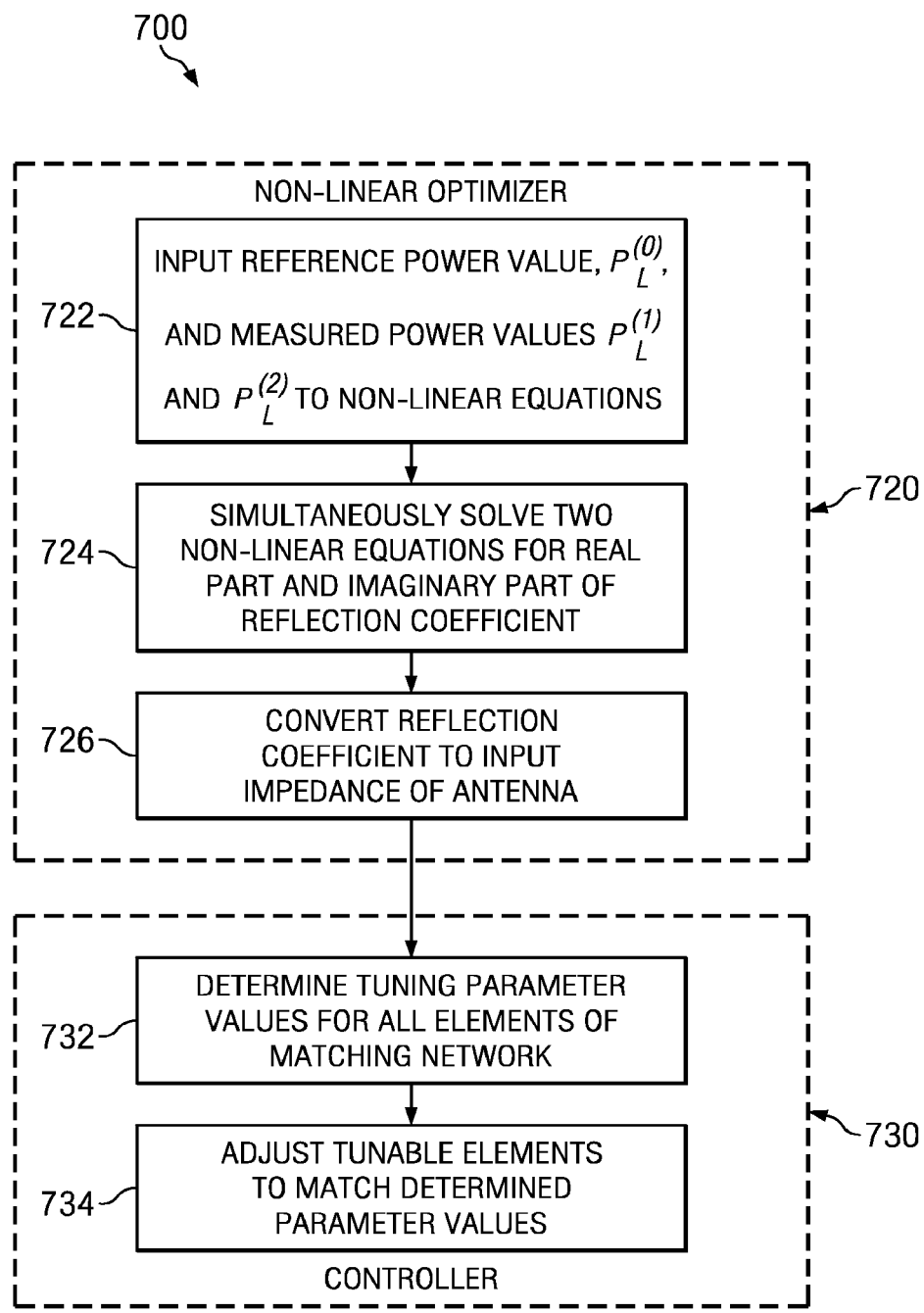
FIG. 7 illustrates a detailed flowchart of the operation of the receiver system according to an embodiment of the disclosure.

In FIG. 7, diagram 700 provides a more detailed flow of the operation of the receiver system in accordance with an illustrative embodiment of the disclosure. The procedures represented in block 720 may be performed by a non-linear optimizer. The procedures in block 730 may be performed by a controller or a control system. The controller or control system may be a microprocessor, field programmable gate array that comprises programmable logic or other processing or similar control circuit known to one skilled in the art. It must be noted that diagram 700 represents only one embodiment of the current disclosure. Other alternative embodiments that feature block 720 and block 730 performing a greater or reduced number of operations may be realized as would be obvious to one skilled in the art. Turning first to the non-linear optimizer operations as disclosed in block 720, input reference power value $P_L^{(0)}$ and measured power values $P_L^{(1)}$ and $P_L^{(2)}$ are determined by the controller and formulated into power ratios that are input into the two non-linear equations that are solved by the non-linear optimizer. At block 724, the non-linear optimizer simultaneously solves the two non-linear equations for the real and imaginary values of reflection coefficient of the antenna. The complex value of the reflection coefficient may be converted at block 726 to the real and imaginary values of the input impedance of the antenna. In one or more illustrative embodiments, the conversion of the complex value of the reflection coefficient to the input impedance value of the antenna may be performed by the non-linear optimizer. In one or more illustrative embodiments, the controller may perform the conversion of the complex value of the reflection coefficient to the real and imaginary values of the input impedance of the antenna.

The controller may operate at block 730 to determine parameter values for all the reactive elements of the matching network based on the determined input impedance of the antenna. At block 732, the matching network may be adapted or tuned to specific parameter values that will enable the matching network to match the determined input impedance of the antenna. At block 734, tunable elements of the matching network are finally adjusted to match the determined parameter values.

Figure 8:
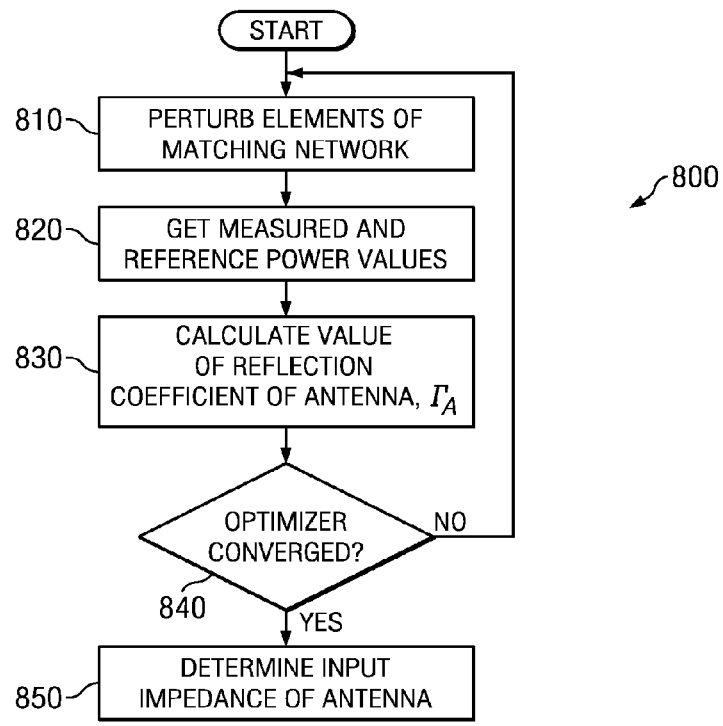
FIG. 8 illustrates a flowchart that represent further detailed operations of the non-linear optimizer according to an embodiment of the disclosure.

In FIG. 8, flowchart 800 represents a more detailed view of a process of determining the input impedance of the antenna. The process begins at block 810. The reactive elements of the matching network are perturbed or varied by a percentage of their original value. Perturbation refers to adjusting the values of the tuning elements in the matching network to determine the effect on the received power. The tuning elements of the network may be reactive elements, such as, but in no way limited to capacitors, inductors, or other such reactive elements know to one skilled in the art. The values of the tuning elements represent a specific tuning position of the elements in the matching network. For example, the perturbation may be at least a positive 30 percent or more of the value of an element. Perturbations may also be negative in value. For example the perturbation of an element may be a negative 30 percent or more of the value of an element. At least two perturbations may be performed. The received power is determined with each perturbation of the reactive elements in the matching network.

A reference power value is also determined. The reference power value may be the received power determined from a previous tuning period. At block 820, the power values measure after perturbations of the matching network and a reference power value is input into two non-linear equations. The two non-linear equations are formulated so that the reception coefficient of the antenna may be calculated at block 830. The value of the reflection coefficient of the antenna is determined by a non-linear optimizer which converges to the correct value after a number of iterations. The method checks to determine whether the optimizer has converged at block 840. If the optimizer converges, the input impedance of the antenna is determined at block 850. If the optimizer does not converge, the method returns to block 810 where the process of determining a measured power value begins again with a perturbation of the reactive elements of the matching network.

Figure 9:
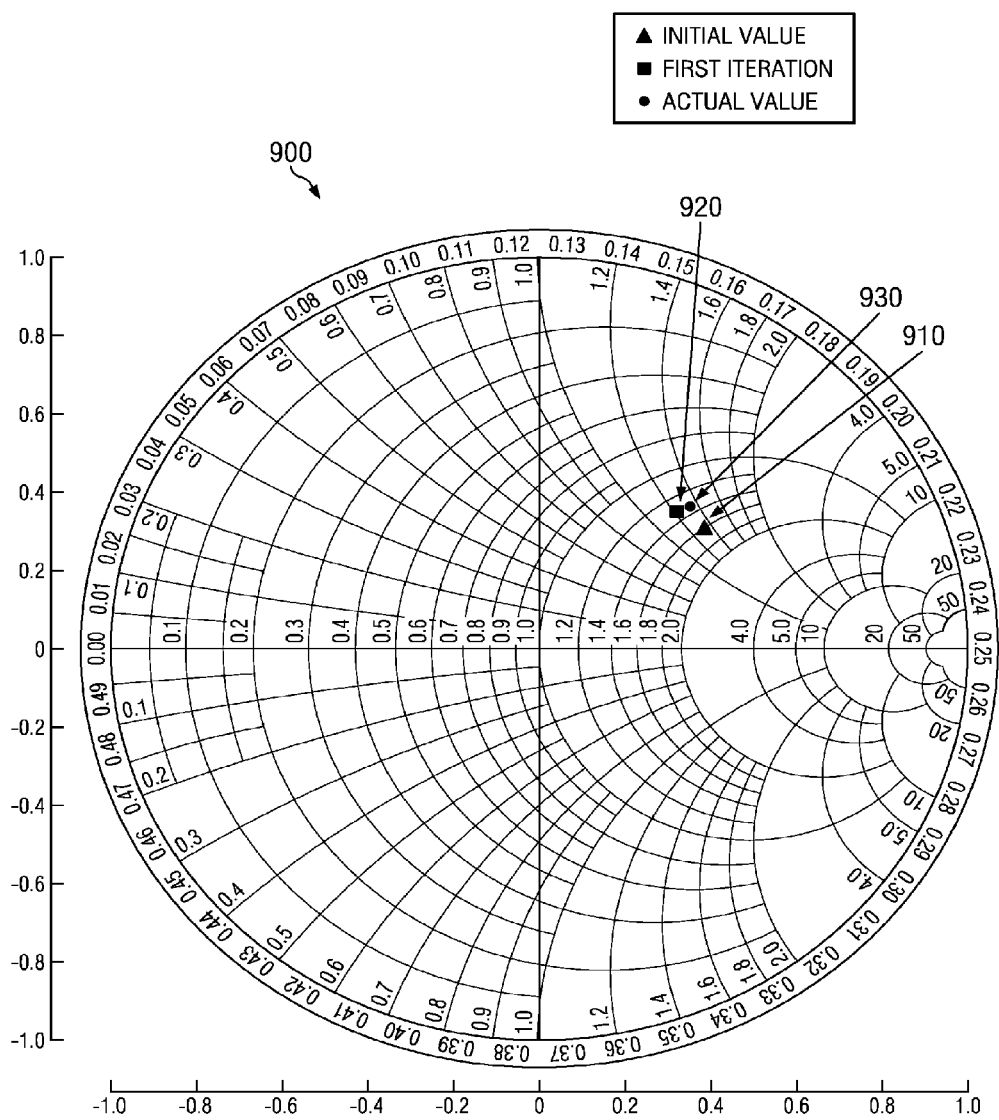
FIG. 9 illustrates a Smith chart that illustrates the convergence of the non-linear optimizer according to an embodiment of the disclosure.

In FIG. 9, Smith chart 900 illustrates the process of convergence that may be implemented by the non-linear optimizer in accordance with an illustrative embodiment of the disclosure. Smith chart 900 illustrates convergence of the non-linear optimizer to the actual input impedance value of the antenna within a number of iterations. In the specific embodiment of Smith chart 900, the process converges to a final value within two iterations. The input impedance value is represented by a complex number comprised of a real part and imaginary part.

Smith chart 900 illustrates that an initial complex value input into the non-linear optimizer is the complex number 81+j65 910. During a first iteration, the second complex value of 63+j64.5 is obtained at 920. At 930, the optimizer converges to the actual input impedance value of 65+j63.

The non-linear optimizer converges fairly quickly at a quadratic convergence rate regardless of the initial value input into the non-linear optimizer. It must be recognized that more than two iterations may be needed in order to achieve a final convergence. In some cases, convergence is only possible through determining and inputting additional measured power values determined from additional perturbation of the reactive elements of the matching network. However, the nature of the non-linear equations disclosed earlier may be considered as complex mathematical problems that will always converge at a quadratic rate within two to three iterations of a non-linear optimizer.

Figure 10:
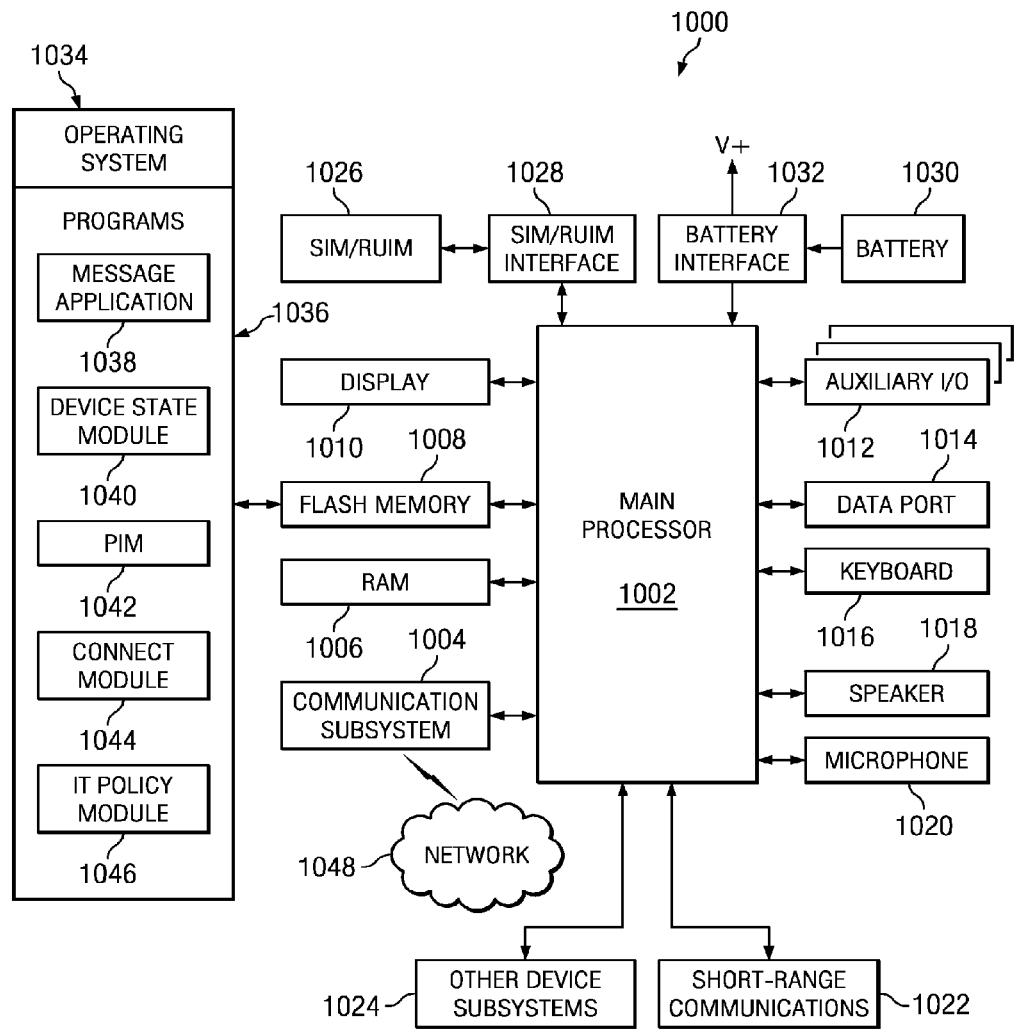
FIG. 10 illustrates a block diagram of a mobile device according to an illustrative embodiment of the disclosure.

Referring next to FIG. 10, shown therein is a block diagram of a mobile device 1000 in accordance with an illustrative embodiment of the disclosure. Mobile device 1000 is operable for implementing aspects of the disclosure and may include, for example, without limitation, control system 210 and radio frequency transceiver system 230 illustrated in FIG. 2, but the disclosure should not be limited to such implementations. Mobile device 1000 may include a number of components, such as main processor 1002, that control the overall operation of mobile device 1000. Communication functions, including data and voice communications, are performed through communication subsystem 1004.

Mobile device 1000 may be part of a wireless communications system that includes network 1048. Communication subsystem 1004 receives messages and other information from and sends messages and other information to wireless network 1048. In this illustrative embodiment of mobile device 1000, communication subsystem 1004 is configured in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS). New standards are still being defined, but it is believed that they will have similarities to the network behavior described herein, and it will also be understood by persons skilled in the art that the embodiments described herein are intended to use any other suitable standards that are developed in the future. The wireless link connecting communication subsystem 1004 with wireless network 1048 represents one or more different Radio Frequency (RF) channels, operating according to defined protocols specified for GSM/GPRS communications. With newer network protocols, these channels are capable of supporting both circuit switched voice communications and packet switched data communications.

Although wireless network 1048 associated with mobile device 1000 is a GSM/GPRS wireless network in one illustrative implementation, other wireless networks may also be associated with mobile device 1000 in variant implementations. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA2000 networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems.

Main processor 1002 also interacts with additional subsystems, such as Random Access Memory (RAM) 1006, flash memory 1008, display 1010, auxiliary input/output (I/O) subsystem 1012, data port 1014, keyboard 1016, speaker 1018, microphone 1020, short-range communications subsystem 1022 and other device subsystems 1024.

Some of the subsystems of mobile device 1000 perform communication-related functions, whereas other subsystems may provide "resident" or on-device functions. By way of example, display 1010 and keyboard 1016 may be used for both communication-related functions, such as entering a text message for transmission over wireless network 1048 and device-resident functions such as a calculator or task list.

Mobile device 1000 can send and receive communication signals over wireless network 1048 after required network registration or activation procedures have been completed. Network access is associated with a subscriber or user of mobile device 1000. To identify a subscriber, mobile device 1000 requires SIM/RUIM card 1026 (i.e. Subscriber Identity Module or a Removable User Identity Module) to be inserted into SIM/RUIM interface 1028 in order to communicate with a network. SIM/RUIM card 1026 is one type of a conventional "smart card" that can be used to identify a subscriber of mobile device 1000 and to personalize mobile device 1000, among other things. Without SIM/RUIM card 1026, mobile device 1000 is not fully operational for communication with wireless network 1048. By inserting SIM/RUIM card 1026 into SIM/RUIM interface 1028, a subscriber can access all subscribed services. Services may include: web browsing and messaging such as e-mail, voice mail, Short Message Service (SMS), and Multimedia Messaging Services (MMS). More advanced services may include: point of sale, field service and sales force automation. SIM/RUIM card 1026 includes a processor and memory for storing information.

Once SIM/RUIM card 1026 is inserted into SIM/RUIM interface 1028, it is coupled to main processor 1002. In order to identify the subscriber, SIM/RUIM card 1026 can include some user parameters such as an International Mobile Subscriber Identity (IMSI). An advantage of using SIM/RUIM card 1026 is that a subscriber is not necessarily bound by any single physical mobile device. SIM/RUIM card 1026 may store additional subscriber information for a mobile device as well, including datebook (or calendar) information and recent call information. Alternatively, user identification information can also be programmed into flash memory 1008.

Mobile device 1000 is a battery-powered device and includes battery interface 1032 for receiving one or more battery 1030. In at least some embodiments, battery 1030 can be a smart battery with an embedded microprocessor. Battery interface 1032 is coupled to a regulator (not shown), which assists battery 1030 in providing power V+ to mobile device 1000. Although current technology makes use of a battery, future technologies such as micro fuel cells may provide the power to mobile device 1000.

Mobile device 1000 also includes operating system 1034 and software components 1036 to 1046 which are described in more detail below. Operating system 1034 includes programs 1036, message application 1038, device state module 1040, PIM 1042, connect module 1044, and IT policy module 1046 that are executed by main processor 1002 and are typically stored in a persistent storage, such as flash memory 1008, which may alternatively be a read-only memory (ROM) or similar storage element (not shown). In some embodiments, processor 1002 may function as a controller that comprises a number of processing units. Those skilled in the art will appreciate that portions of operating system 1034 and software components 1036 to 1046, such as specific device applications, or parts thereof, may be temporarily loaded into a volatile store such as RAM 1006. Other software components can also be included, as is well known to those skilled in the art.

The subset of programs 1036 that control basic device operations, including data and voice communication applications, will normally be installed on mobile device 1000 at sometime during the manufacture or configuration of the mobile device 1000. The processes disclosed herein may be implemented by a computer implemented process in which the different illustrated actions may take the form of program code embodied on a computer recordable storage medium or device for execution by a controller or processor unit, such as main processor 1002. The recordable storage medium or device may be, for example, a hard disk drive, a flash drive, a solid state disk drive, a floppy disk, a CD-ROM, DVD-ROM or some other such mechanical storage device.

Other software applications include message application 1038 that can be any suitable software program that allows a user of mobile device 1000 to send and receive electronic messages. Various alternatives exist for message application 1038 as is well known to those skilled in the art. Messages that have been sent or received by the user are typically stored in flash memory 1008 of mobile device 1000 or some other suitable storage element in mobile device 1000. In at least some embodiments, some of the sent and received messages may be stored remotely from mobile device 1000 such as in a data storage of an associated host system that communicates with mobile device 1000.

The software applications can further include device state module 1040, Personal Information Manager (PIM) 1042, and other suitable modules (not shown). Device state module 1040 provides persistence, i.e. device state module 1040 ensures that important device data is stored in persistent memory, such as flash memory 1008, so that the data is not lost when mobile device 1000 is turned off or loses power.

PIM 1042 includes functionality for organizing and managing data items of interest to the user, such as, but not limited to, e-mail, contacts, calendar events, voice mails, appointments, and task items. A PIM application has the ability to send and receive data items via wireless network 1048. PIM data items may be seamlessly integrated, synchronized, and updated via wireless network 1048 with the mobile device subscriber's corresponding data items stored and/or associated with a host computer system. This functionality creates a mirrored host computer on mobile device 1000 with respect to such items. This can be particularly advantageous when the host computer system is the mobile device subscriber's office computer system.

Mobile device 1000 also includes connect module 1044, and IT policy module 1046. Connect module 1044 implements the communication protocols that are required for mobile device 1000 to communicate with the wireless infrastructure and any host system, such as an enterprise system, that is authorized to interface with mobile device 1000 is. Examples of a wireless infrastructure and an enterprise system are given in FIG. 12, which are described in more detail below.

Connect module 1044 includes a set of application program interfaces (APIs) that can be integrated with mobile device 1000 to allow mobile device 1000 to use any number of services associated with the enterprise system. Connect module 1044 allows mobile device 1000 to establish an end-to-end secure, authenticated communication pipe with the host system. A subset of applications for which access is provided by connect module 1044 can be used to pass IT policy commands from the host system to mobile device 1000. This can be done in a wireless or wired manner. These instructions may be passed to IT policy module 1046 to modify the configuration of mobile device 1000. Alternatively, in some cases, the IT policy update can also be done over a wired connection.

IT policy module 1046 receives IT policy data that encodes the IT policy. IT policy module 1046 ensures that the IT policy data is authenticated by mobile device 1000. The IT policy data may be stored in flash memory 1008 in its native form. After the IT policy data is stored, a global notification can be sent by IT policy module 1046 to all of the applications residing on mobile device 1000. Applications for which the IT policy may be applicable may respond by reading the IT policy data to look for IT policy rules that are applicable.

IT policy module 1046 may include a parser (not shown), which can be used by the applications to read the IT policy rules. In some cases, another module or application can provide the parser. Grouped IT policy rules, described in more detail below, are retrieved as byte streams, which are sent (recursively, in a sense) into the parser to determine the values of each IT policy rule defined within the grouped IT policy rule. In at least some embodiments, IT policy module 1046 can determine which applications are affected by the IT policy data and send a notification to only those applications. In either of these cases, for applications that aren't running at the time of the notification, the applications can call the parser or IT policy module 1046 when they are executed to determine if there are any relevant IT policy rules in the newly received IT policy data.

All applications that support rules in the IT Policy are coded to know the type of data to expect. For example, the value that is set for the "WEP User Name" IT policy rule is known to be a string; therefore the value in the IT policy data that corresponds to this rule is interpreted as a string. As another example, the setting for the "Set Maximum Password Attempts" IT policy rule is known to be an integer, and therefore the value in the IT policy data that corresponds to this rule is interpreted as such.

After the IT policy rules have been applied to the applicable applications or configuration files, IT policy module 1046 sends an acknowledgement back to the host system to indicate that the IT policy data was received and successfully applied.

Other types of software applications can also be installed on mobile device 1000. These software applications may be third party applications, which are added after the manufacture of the mobile device 1000. Examples of third party applications include games, calculators, utilities, and program code that is executable by a processor, such as main processor 1002 to implement various embodiments described in this disclosure.

The additional applications can be loaded onto mobile device 1000 through at least one of wireless network 1048, auxiliary I/O subsystem 1012, data port 1014, short-range communications subsystem 1022, or any other suitable device subsystem 1024. This flexibility in application installation increases the functionality of mobile device 1000 and may provide enhanced on-device functions, communication-related functions, or both. For example, secure communication applications may enable electronic commerce functions and other such financial transactions to be performed using mobile device 1000.

Data port 1014 enables a subscriber to set preferences through an external device or software application and extends the capabilities of mobile device 1000 by providing for information or software downloads to mobile device 1000 other than through a wireless communication network. The alternate download path may, for example, be used to load an encryption key onto mobile device 1000 through a direct and thus reliable and trusted connection to provide secure device communication.

Data port 1014 can be any suitable port that enables data communication between mobile device 1000 and another computing device. Data port 1014 can be a serial or a parallel port. In some instances, data port 1014 can be a USB port that includes data lines for data transfer and a supply line that can provide a charging current to charge battery 1030 of mobile device 1000.

Short-range communications subsystem 1022 provides for communication between mobile device 1000 and different systems or devices, without the use of wireless network 1048. For example, short-range communications subsystem 1022 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an e-mail message, or web page download will be processed by communication subsystem 1004 and input to main processor 1002. Main processor 1002 will then process the received signal for output to display 1010 or alternatively to auxiliary I/O subsystem 1012. A subscriber may also compose data items, such as e-mail messages, for example, using keyboard 1016 in conjunction with display 1010 and possibly auxiliary I/O subsystem 1012. Auxiliary I/O subsystem 1012 may include devices such as: a touch screen, mouse, track ball, infrared fingerprint detector, or a roller wheel with dynamic button pressing capability. Keyboard 1016 is preferably an alphanumeric keyboard and/or telephone-type keypad. However, other types of keyboards may also be used. A composed item may be transmitted over wireless network 1048 through communication subsystem 1004.

For voice communications, the overall operation of mobile device 1000 is substantially similar, except that the received signals are output to speaker 1018, and signals for transmission are generated by microphone 1020. Alternative voice or audio I/O subsystems, such as a voice message recording subsystem, can also be implemented on mobile device 1000. Although voice or audio signal output is accomplished primarily through speaker 1018, display 1010 can also be used to provide additional information such as the identity of a calling party, duration of a voice call, or other voice call related information.

Figure 11:
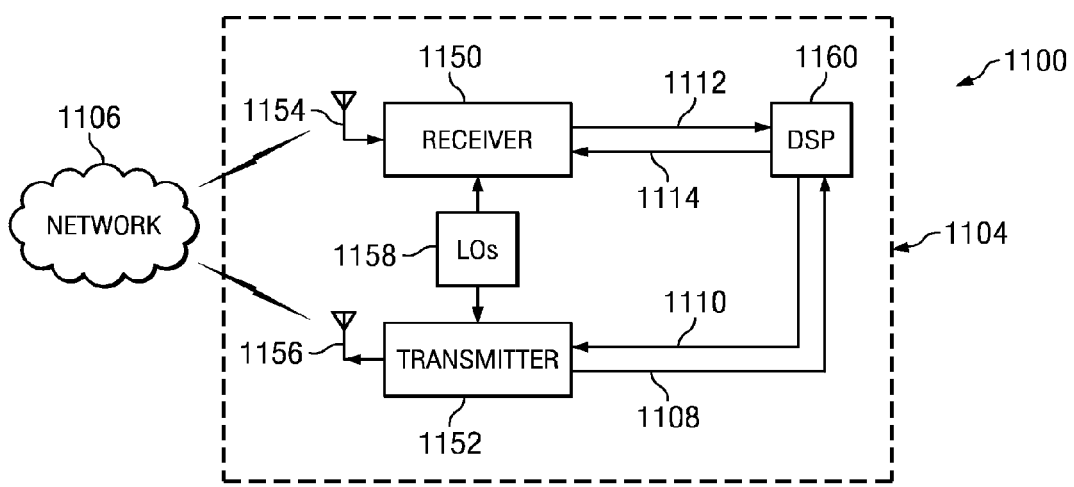
FIG. 11 illustrates a block diagram of an embodiment of a communication subsystem component of the mobile device of FIG. 10.

Referring now to FIG. 11, illustrative block diagram 1100 of communication subsystem 1104 is shown in accordance with an illustrative embodiment of the disclosure. Communication subsystem 1104 includes receiver 1150, transmitter 1152, as well as associated components such as one or more embedded or internal antenna elements 1154 and 1156, Local Oscillators (LOs) 1158, and a processing module such as Digital Signal Processor (DSP) 1160. In an illustrative embodiment, receiver 1150 and transmitter 1152 may be part of a single transceiver unit, such as radio frequency transceiver system 230 illustrated in FIG. 2. The particular design of communication subsystem 1104 is dependent upon wireless network 1106 with which mobile device 1000 illustrated in FIG. 10, or other applicable communication device is intended to operate. Other applicable communication devices include, but are in no way limited to, pagers, cellular phones, cellular smart-phones, wireless organizers, and handheld wireless communication devices. Thus, it should be understood that the design illustrated in FIG. 11 serves only as one example.

Signals received by antenna element 1154 through wireless network 1106 are input to receiver 1150, which may perform such common receiver functions as signal amplification, frequency down conversion, filtering, channel selection, and analog-to-digital (A/D) conversion. A/D conversion of a received signal allows more complex communication functions such as demodulation and decoding to be performed in DSP 1160. In a similar manner, signals to be transmitted are processed, including modulation and encoding, by DSP 1160. These DSP-processed signals are input to transmitter 1152 for digital-to-analog (D/A) conversion, frequency up conversion, filtering, amplification and transmission over wireless network 1106 via antenna element 1154. DSP 1160 not only processes communication signals 1110, but also provides for receiver control through control signals 1114 and transmitter control by control signals 1108. For example, the gains applied to communication signals in receiver 1150 and transmitter 1152 may be adaptively controlled through automatic gain control algorithms implemented in DSP 1160.

The wireless link between mobile device 1000 illustrated in FIG. 10, and wireless network 1106 can contain one or more different channels. Typically, different RF channels and associated protocols are used between mobile device 1000 illustrated in FIG. 10 and wireless network 1106. An RF channel is a limited resource that must be conserved, typically due to limits in overall bandwidth and limited battery power of mobile device 1000 illustrated in FIG. 10.

When mobile device 1000 illustrated in FIG. 10 is fully operational, transmitter 1152 is typically keyed or turned on only when it is transmitting to wireless network 1106 and is otherwise turned off to conserve resources. Similarly, receiver 1150 is periodically turned off to conserve power until it is needed to receive signals or control information (if at all) during designated time periods.

Figure 12:
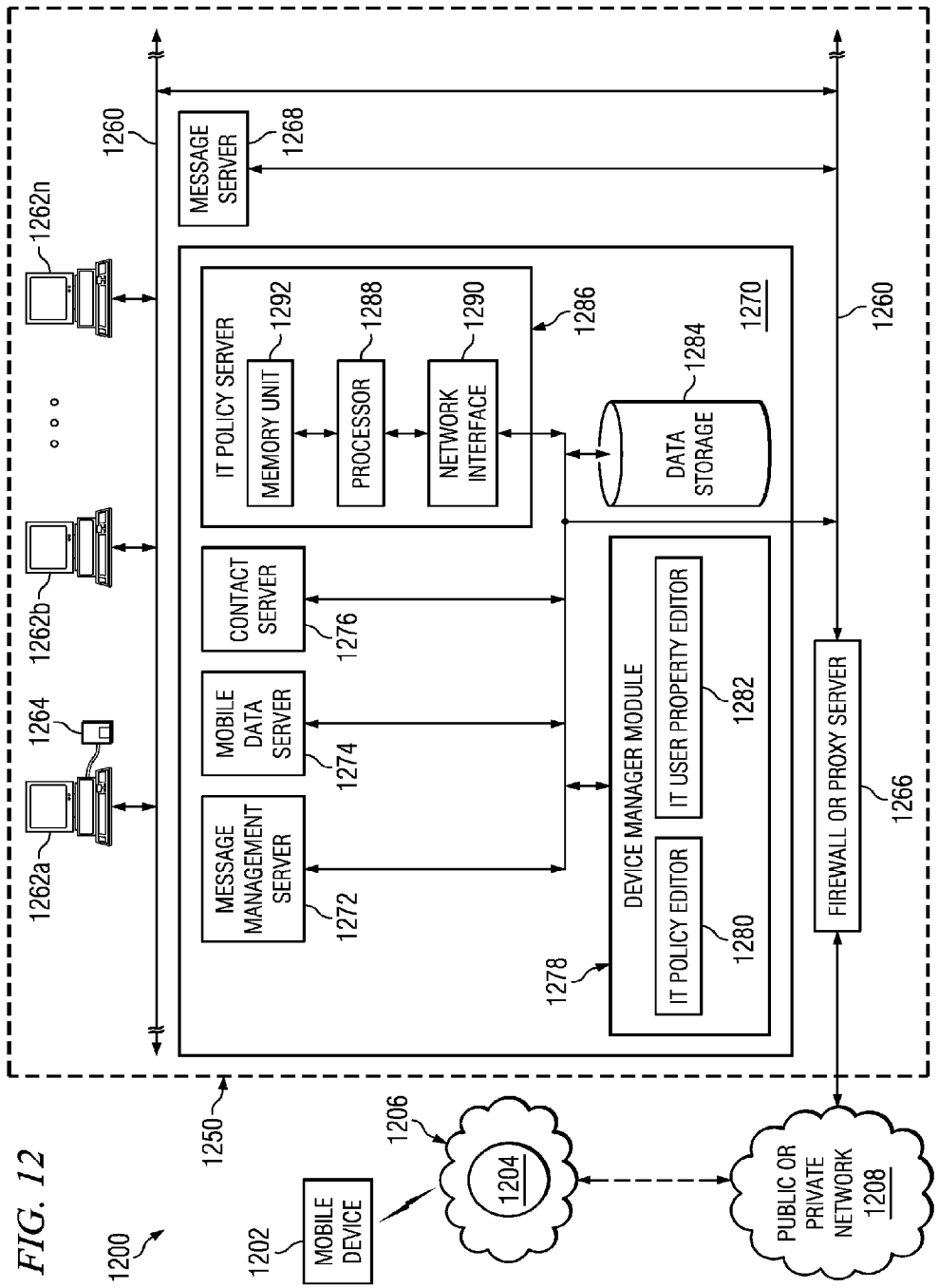
FIG. 12 illustrates a block diagram illustrating components of a host system in one configuration for use with the mobile device of FIG. 10.

Referring now to FIG. 12, shown therein is block diagram 1200 illustrating components of an illustrative configuration of host system 1250 that mobile device 1202 can communicate with in conjunction with connect module 1044 of mobile device 1000 in FIG. 10. In one illustrative embodiment, host system 1250 may be a corporate enterprise or a local area network (LAN), but may also be a home office computer or some other private system, for example, in variant implementations. In another illustrative embodiment, host system 1250 may be a network server comprising a computer recordable storage medium, such as memory unit 1292, described later, that stores instructions and other information. In the illustrative example shown in FIG. 12, host system 1250 is depicted as a LAN of an organization to which a user of mobile device 1000 in FIG. 10 belongs. Typically, a plurality of mobile devices can communicate wirelessly with host system 1250 through one or more nodes 1204 of wireless network 1206.

Host system 1250 comprises a number of network components connected to each other by network 1260. For instance, user computer 1262a with accompanying cradle 1264 for the user's mobile device 1202 is situated on a LAN connection. Cradle 1264 for mobile device 1202 can be coupled to computer 1262a by a serial or a Universal Serial Bus (USB) connection, for example. Other user computers, 1262b-1262n, are also situated on network 1260, and each may or may not be equipped with accompanying cradle 1264. Cradle 1264 facilitates the loading of information (e.g. PIM data, private symmetric encryption keys to facilitate secure communications) from user computer 1262a to mobile device 1202, and may be particularly useful for bulk information updates often performed in initializing mobile device 1202 for use. The information downloaded to mobile device 1202 may include certificates used in the exchange of messages.

It will be understood by persons skilled in the art that user computers 1262a-1262n will typically also be connected to other peripheral devices, such as printers, etc., which are not explicitly shown in FIG. 12. Furthermore, only a subset of network components of host system 1250 are shown in FIG. 12 for ease of exposition, and it will be understood by persons skilled in the art that host system 1250 will comprise additional components that are not explicitly shown in FIG. 12 for this illustrative configuration. More generally, host system 1250 may represent a smaller part of a larger network (not shown) of the organization, and may comprise different components and/or be arranged in different topologies than that shown in the illustrative embodiment of FIG. 12.

To facilitate the operation of mobile device 1202 and the wireless communication of messages and message-related data between mobile device 1202 and components of host system 1250, number of wireless communication support components 1270 can be provided. In some implementations, wireless communication support components 1270 can include message management server 1272, mobile data server 1274, contact server 1276, and device manager module 1278. Device manager module 1278 includes IT Policy editor 1280 and IT user property editor 1282, as well as other software components for allowing an IT administrator to configure mobile device 1202. In an alternative embodiment, there may be one editor that provides the functionality of both IT policy editor 1280 and IT user property editor 1282.

Support components 1270 also include data storage 1284 and IT policy server 1286. IT policy server 1286 includes processor 1288, network interface 1290 and memory unit 1292. Processor 1288 controls the operation of IT policy server 1286 and executes functions related to the standardized IT policy as described below. Network interface 1290 allows IT policy server 1286 to communicate with the various components of host system 1250 and mobile device 1202. Memory unit 1292 can store functions used in implementing the IT policy as well as related data. Those skilled in the art know how to implement these various components. Other components may also be included as is well known to those skilled in the art. Further, in some implementations, data storage 1284 can be part of any one of the servers.

In this illustrative embodiment, mobile device 1202 communicates with host system 1250 through node 1204 of wireless network 1206 and public/private network infrastructure 1208 such as a service provider network or the public Internet. Access to host system 1250 may be provided through one or more routers (not shown), and computing devices of host system 1250 may operate from behind a firewall or proxy server 1266. Firewall or proxy server 1266 provides a secure node and a wireless internet gateway for host system 1250. Firewall or proxy server 1266 intelligently routes data to the correct destination server within host system 1250.

In some implementations, host system 1250 can include a wireless VPN router (not shown) to facilitate data exchange between host system 1250 and mobile device 1202. The wireless VPN router allows a VPN connection to be established directly through a specific wireless network to mobile device 1202. The wireless VPN router can be used with the Internet Protocol (IP) Version 6 (IPV6) and IP-based wireless networks. This protocol can provide enough IP addresses so that each mobile device has a dedicated IP address, making it possible to push information to a mobile device at any time. An advantage of using a wireless VPN router is that it can be an off-the-shelf VPN component, and does not require a separate wireless gateway and separate wireless infrastructure. A VPN connection can preferably be a Transmission Control Protocol (TCP)/IP or User Datagram Protocol (UDP)/IP connection for delivering the messages directly to mobile device 1202 in this alternative implementation.

Message management server 1272 can be used to specifically provide support for the management of messages, such as e-mail messages, that are to be handled by mobile devices. Generally, while messages are still stored on message server 1268, message management server 1272 can be used to control when, if, and how messages are sent to mobile device 1202. Message management server 1272 also facilitates the handling of messages composed on mobile device 1202, which are sent to message server 1268 for subsequent delivery.

Message management server 1272 may also be adapted to provide other control functions, such as only pushing certain message information or pre-defined portions (e.g. "blocks") of a message stored on message server 1268 to mobile device 1202. For example, in some cases, when a message is initially retrieved by mobile device 1202 from message server 1268, message management server 1272 may push only the first part of a message to mobile device 1202, with the part being of a pre-defined size (e.g. 2 KB). The user can then request that more of the message be delivered in similar-sized blocks by message management server 1272 to mobile device 1202, possibly up to a maximum pre-defined message size. Accordingly, message management server 1272 facilitates better control over the type of data and the amount of data that is communicated to mobile device 1202, and can help to minimize potential waste of bandwidth or other resources.

Mobile data server 1274 encompasses any other server that stores information that is relevant to the host system 1250. Mobile data server 1274 may include, but is not limited to, databases, online data document repositories, customer relationship management (CRM) systems, or enterprise resource planning (ERP) applications.

Contact server 1276 can provide information for a list of contacts for the user in a similar fashion as the address book on mobile device 1202. Accordingly, for a given contact, contact server 1276 can include the name, phone number, work address and e-mail address of the contact, among other information. Contact server 1276 can also provide a global address list that contains the contact information for all of the contacts associated with host system 1250.

It will be understood by persons skilled in the art that message management server 1272, mobile data server 1274, contact server 1276, device manager module 1278, data storage 1284 and IT policy server 1286 do not need to be implemented on separate physical servers within host system 1250. For example, some or all of the functions associated with message management server 1272 may be integrated with message server 1268, or some other server in host system 1250. Alternatively, host system 1250 may comprise multiple message management servers 1272, particularly in variant implementations where a large number of mobile devices need to be supported.

Alternatively, in some embodiments, IT policy server 1286 can provide IT policy editor 1280, IT user property editor 1282 and data storage 1284. In some cases, IT policy server 1286 can also provide device manager module 1278. Processor 1288 of IT policy server 1286 can be used to perform the various steps of a method for providing IT policy data that is customizable on a per-user basis. Processor 1288 can execute IT policy editor 1280 and IT user property editor 1282. In some cases, the functionality of IT policy editor 1280 and IT user property editor 1282 can be provided by a single editor. In some cases, memory unit 1292 can provide data storage 1284.

Device manager module 1278 provides an IT administrator with a graphical user interface with which the IT administrator interacts to configure various settings for the mobile devices. As mentioned, the IT administrator can use IT policy rules to define behaviors of certain applications on mobile device 1202 that are permitted such as phone, web browser or Instant Messenger use. The IT policy rules can also be used to set specific values for configuration settings that an organization requires on the mobile devices such as auto signature text, WLAN/VoIP/VPN configuration, security requirements (e.g. encryption algorithms, password rules, etc.), specifying themes or applications that are allowed to run on mobile device 1202.

The various embodiments of the present disclosure increases the power delivered from an antenna to the receiver circuitry, such as receiver system 240, illustrated in FIG. 2. The increased power received by the receiver circuitry results in greater sensitivity, fewer dropped calls, and better audio quality.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein.

The embodiment or embodiments selected are chosen and described in order to best explain the principles of the embodiments, the practical application, and to enable others of ordinary skill in the art to understand the disclosure for various embodiments with various modifications as are suited to the particular use contemplated. For example, the various elements or components may be combined or integrated in another system or certain features may be omitted or not implemented.

Also, techniques, systems, and subsystems, and described and illustrated in the various embodiments as discrete or separate may be combined or integrated with other systems, modules, or techniques without departing from the scope of the present disclosure. Other items shown or discussed as coupled or directly coupled or communicating with each other may be indirectly coupled or communicated through some other interface, device or intermediate component whether electrically, mechanically, or otherwise. Other examples of changes, substitutions, and alterations are ascertainable by one skilled in the art and could be made without departing from the spirit and scope disclosed herein.

What is claimed is:

1. A radio frequency (RF) receiver comprising:
an antenna having a feed point;
a tunable matching network connected to the antenna feed point to receive RF signals from the antenna;

power detector, connected to point to the RF receiver, to measure at the single node power levels of the received RF signals output from said feed point; and a control system that calculates values of tuning elements of the tunable matching network to match an input impedance of the antenna at the feed point by using at least three power level measurements simultaneously in two non-linear equations, the at least three power level measurements being detected at said single node by said power detector, wherein a first non-linear equation of the two non-linear equations is formulated as:

$$\frac{P_L^{(1)}}{P_L^{(0)}} = \frac{|S_{22}^{(1)}|^2|1-S_{22}^{(0)}\Gamma_L|^2|1-\Gamma_A\Gamma_{in}^{(0)}|^2}{|S_{21}^{(0)}|^2|1-S_{22}^{(1)}\Gamma_L|^2|1-\Gamma_A\Gamma_{in}^{(1)}|^2},$$

wherein $$\frac{P_L^{(1)}}{P_L^{(0)}}$$

is the ratio of power received by the reactive elements of the matching network; $S_{22}^{(1)}$ is a scattering matrix parameter that represents an output reflection coefficient of a 50 ohm terminated input after a first perturbation of the matching network; $S_{22}^{(0)}$ is a matrix parameter that represents an output reflection coefficient of a 50 ohm terminated input in a previous tuning period; $S_{21}^{(0)}$ is a scattering matrix parameter which represents the forward transmission coefficient of a 50 ohm terminated output in a previous tuning period; $\Gamma_L$ is a reflection coefficient of the load, and $\Gamma_{in}^{(0)}$ is an input reflection coefficient of the matching network as seen from the antenna in a previous tuning period; $\Gamma_{in}^{(2)}$ is an input reflection coefficient of the matching network as seen from the antenna after a first perturbation of the matching network; and $\Gamma_A$ is a reflection coefficient of the antenna.

2. The receiver of claim 1, wherein the control system calculates a complex value of the input impedance.

3. The receiver of claim 1, wherein a first non-linear equation includes a reflection coefficient of the antenna and scattering parameters of the matching network.

4. The receiver of claim 1, wherein a first of said three power level measurements is detected after a first perturbation of a number of reactive elements in the matching network.

5. The receiver of claim 1 wherein a second of said three power level measurements is detected after a second perturbation of a number of reactive elements in the matching network.

6. The receiver of claim 1 wherein a third of said three power level measurements is detected after a third perturbation of a number of reactive elements in the matching network.

7. The receiver of claim 1, wherein a second non-linear equation of the two non-linear equations is formulated as:

$$\frac{P_L^{(2)}}{P_L^{(0)}} = \frac{|S_{21}^{(2)}|^2|1-S_{22}^{(0)}\Gamma_L|^2|1-\Gamma_A\Gamma_{in}^{(0)}|^2}{|S_{21}^{(0)}|^2|1-S_{22}^{(2)}\Gamma_L|^2|1-\Gamma_A\Gamma_{in}^{(2)}|^2},$$

wherein $$\frac{P_L^2}{P_L^{(0)}}$$

is the ratio of power received by the reactive elements of the matching network; $S_{22}^{(1)}$ is a scattering matrix parameter that represents an output reflection coefficient of a 50 ohm terminated input after a second perturbation of the matching network; $S_{22}^{(0)}$ is a matrix parameter that represents an output reflection coefficient of a 50 ohm terminated input in a previous tuning period; $S_{21}^{(0)}$ is a scattering matrix parameter which represents the forward transmission coefficient of a 50 ohm terminated output in a previous tuning period; $S_{21}^{(2)}$ is a scattering matrix parameter which represents the forward transmission coefficient of a 50 ohm terminated output after a second perturbation of the matching network; $\Gamma_L$ is a reflection coefficient of the load, and $\Gamma_{in}^{(0)}$ is an input reflection coefficient of the matching network as seen from the antenna in a previous tuning period; $\Gamma_{in}^{(2)}$ is an input reflection coefficient of the matching network as seen from the antenna after a second perturbation of the matching network; and $\Gamma_A$ is the reflection coefficient of the antenna.

8. A method of matching an input impedance of an antenna to a receiver, the method comprising:

connecting a tunable matching network in an RF signal path from a feed point of the antenna to the receiver;

detecting at a single node in the RF signal path power levels of received RF signals; and calculating values of tuning elements of the tunable matching network to match an input impedance of the antenna by use of at least three different power levels simultaneously in two non-linear equations, the at least three power level measurements being measured at said single node detected by said power detector, wherein a first non-linear equation of the two non-linear equations is formulated as:

$$\frac{P_L^{(1)}}{P_L^{(0)}} = \frac{|S_{22}^{(1)}|^2|1-S_{22}^{(0)}\Gamma_L|^2|1-\Gamma_A\Gamma_{in}^{(0)}|^2}{|S_{21}^{(0)}|^2|1-S_{22}^{(1)}\Gamma_L|^2|1-\Gamma_A\Gamma_{in}^{(1)}|^2},$$

wherein $$\frac{P_L^{(1)}}{P_L^{(0)}}$$

is the ratio of power received by the reactive elements of the matching network; $S_{22}^{(1)}$ is a scattering matrix parameter that represents an output reflection coefficient of a 50 ohm terminated input after a first perturbation of the matching network; $S_{22}^{(0)}$ is a matrix parameter that represents an output reflection coefficient of a 50 ohm terminated input in a previous tuning period; $S_{21}^{(0)}$ is a scattering matrix parameter which represents the forward transmission coefficient of a 50 ohm terminated output in a previous tuning period; $\Gamma_L$ is a reflection coefficient of the load, and $\Gamma_{in}^{(0)}$ is an input reflection coefficient of the matching network as seen from the antenna in a previous tuning period; $\Gamma_{in}^{(2)}$ is an input reflection coefficient of the matching network as seen from the antenna after a first perturbation of the matching network; and $\Gamma_A$ is a reflection coefficient of the antenna.

9. The method of claim 8, including using the three power level to solve two non-linear equations to calculation the values of the tuning elements.

10. The method of claim 8, wherein said calculating calculates a complex value of the input impedance.

11. The method of claim 8, including using a reflection coefficient of the antenna and scattering parameters of the matching network in a first of the two non-linear equations.

12. The method of claim 8, including perturbing a number of reactive elements in the matching network before detecting a first of said three power levels.

13. The method of claim 12, including perturbing a second number of reactive elements in the matching network before detecting a second of said three power levels.

14. The method of claim 12, including perturbing a third number of reactive elements in the matching network before detecting a third of said three power levels.

15. The method of claim 8, wherein a second non-linear equation of the two non-linear equations is formulated as:

$$\frac{P_L^{(2)}}{P_L^{(0)}} = \frac{|S_{21}^{(2)}|^2 |1 - S_{22}^{(0)} \Gamma_L|^2 |1 - \Gamma_A \Gamma_{in}^{(0)}|^2}{|S_{21}^{(0)}|^2 |1 - S_{22}^{(2)} \Gamma_L|^2 |1 - \Gamma_A \Gamma_{in}^{(2)}|^2},$$

wherein $$\frac{P_L^2}{P_L^{(0)}}$$

is the ratio of power received by the reactive elements of the matching network; $S_{22}^{(1)}$ is a scattering matrix parameter that represents an output reflection coefficient of a 50 ohm terminated input after a second perturbation of the matching network; $S_{22}^{(0)}$ is a matrix parameter that represents an output reflection coefficient of a 50 ohm terminated input in a previous tuning period; $S_{21}^{(0)}$ is a scattering matrix parameter which represents the forward transmission coefficient of a 50 ohm terminated output in a previous tuning period; $S_{21}^{(2)}$ is a scattering matrix parameter which represents the forward transmission coefficient of a 50 ohm terminated output after a second perturbation of the matching network; $\Gamma_L$ is a reflection coefficient of the load, and $\Gamma_{in}^{(0)}$ is an input reflection coefficient of the matching network as seen from the antenna in a previous tuning period; $\Gamma_{in}^{(2)}$ is an input reflection coefficient of the matching network as seen from the antenna after a second perturbation of the matching network; and $\Gamma_A$ is the reflection coefficient of the antenna.

* * * * *